United States Patent [19]

Dyer

[11] Patent Number: 4,894,301
[45] Date of Patent: Jan. 16, 1990

[54] BATTERY CONTAINING SOLID PROTONICALLY CONDUCTING ELECTROLYTE

[75] Inventor: Christopher K. Dyer, Chatham Township, Morris County, N.J.

[73] Assignee: Bell Communications Research, Inc., Livingston, N.J.

[21] Appl. No.: 389,507

[22] Filed: Aug. 3, 1989

[51] Int. Cl.$^4$ .............................................. H07M 6/16
[52] U.S. Cl. ..................................... 429/193; 429/33; 429/101
[58] Field of Search ........................... 429/193, 33, 101

[56] References Cited

U.S. PATENT DOCUMENTS

| | | | |
|---|---|---|---|
| 3,057,945 | 10/1962 | Rinnovatore et al. | 429/33 |
| 3,966,492 | 6/1976 | Ludwig | 429/102 |
| 4,732,741 | 3/1988 | Duncan et al. | 429/193 X |

OTHER PUBLICATIONS

*Chemical Abstracts*, vol. 92, No. 113399, Takahashi et al., 1980.

Primary Examiner—Stephen J. Kalafut
Attorney, Agent, or Firm—James W. Falk

[57] ABSTRACT

A rechargeable battery includes a solid protonically conducting electrolyte comprising hydrated aluminum oxide. Two embodiments of the battery are disclosed. In both embodiments, the negative electrode comprises a metal hydride such as $PdH_x$. In one embodiment, the positive electrode comprises a metal such as platinum which serves as a catalyst for oxygen reduction reactions. In the other embodiment, the positive electrode comprises an oxide or hydroxide of a transition metal element. The second-mentioned positive electrode is capable of reversible electrochemical change and charge storage. Both battery embodiments can be made in thin-film form to serve as a constituent of an integrated-circuit assembly.

15 Claims, 1 Drawing Sheet

BATTERY CONTAINING SOLID PROTONICALLY CONDUCTING ELECTROLYTE

BACKGROUND OF THE INVENTION

This invention relates to electrochemical power sources and, more particularly, to rechargeable batteries that include solid electrolytes.

Considerable efforts have been directed to the development of rechargeable batteries that include solid rather than liquid electrolytes. A solid-electrolyte battery exhibits practical advantages such as freedom from fluid leakage. But the solid electrolyte included in some batteries as heretofore constructed possesses low ionic conductivity. Solid electrolytes with higher conductivity have been developed for the alkali metal ions, e.g., sodium and lithium, but electrodes of sodium or lithium show undesirable characteristics such as high reactivity with air. Thus, for example, a battery that includes a lithium-based solid electrolyte and a lithium electrode must be sealed to prevent the occurrence of potentially hazardous reactions between the electrode and air.

Accordingly, efforts have continued by workers skilled in the art aimed at trying to develop other solid-electrolyte batteries. In particular, these efforts have concentrated on trying to develop a rechargeable solid-electrolyte battery that need not be sealed and is mechanically rugged. Also, for some applications of practical importance, it is advantageous that such a battery be capable of being fabricated in a thin-film form that is compatible with integrated-circuit device structures. Hence, this last-mentioned capability has often also been included as a goal of the development efforts.

SUMMARY OF THE INVENTION

First and second embodiments of the principles of the present invention each comprise a rechargeable battery that includes a solid electrolyte comprising hydrated aluminum oxide. The negative electrode of each battery embodiment comprises a metal that can be converted to a metal hydride and back again to the pure metal in a reversible reaction during charging and discharging, respectively. In the first embodiment, the positive electrode comprises a metal that serves as a catalyst for oxygen reduction during discharging. The positive electrode of the second embodiment comprises an oxide or hydroxide of a transition metal element. This second-mentioned positive electrode undergoes electrochemical change and stores charge during battery charging.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
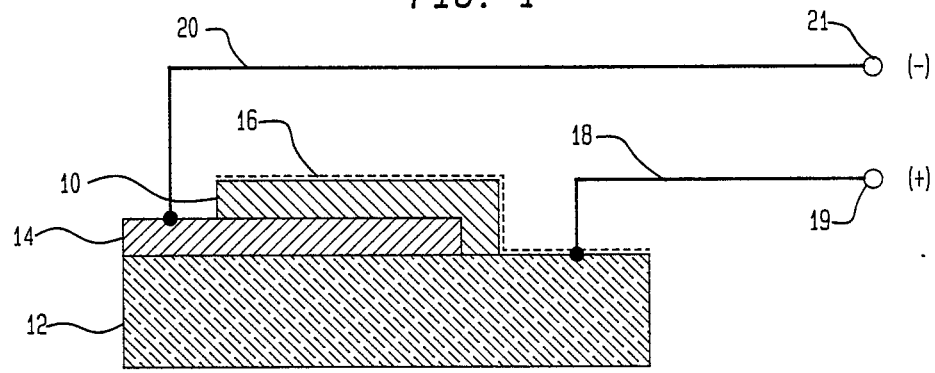
FIG. 1 is a cross-sectional representation of a battery constituting one embodiment of the principles of the present invention.

For illustrative purposes, the particular solid-electrolyte batteries described below will be specified as being made in thin-film form. Such batteries are especially well suited for use with integrated-circuit devices. The batteries can, for example, be fabricated on an integrated-circuit chip to serve as a rechargeable power supply for devices included on the chip.

In accordance with the present invention, the solid electrolyte included in a rechargeable battery comprises hydrated aluminum oxide. Such material and techniques for its formation are described in my commonly assigned copending application Ser. No. 244,350, filed on Sept. 15, 1988 now U.S. Pat. No. 4,863,813. But in that application the electrolyte is combined with permeable and impermeable electrodes to form a fuel cell powered by an oxidizer and a fuel, or to form a gas sensor.

The hydrated aluminum oxide material included in batteries made in accordance with the present invention is characterized by high conductivity for hydrogen ions ($H^+$) and a high resistance (at least $10^6$ ohm-centimeters) for electrons. Such a material will be referred to herein as being protonically conducting.

The physical properties and the conditions required for formation of hydrated aluminum oxide have been extensively studied. A review of many of these studies appears as Chapter 3 of "Oxides and Oxide Films" by R. S. Alwitt, edited by J. W. Diggle and N. K. Vijh, Volume 4, Marcer Dekker, New York, 1976, pages 169-253.

Depending on the particular conditions of formation, the product of the reaction between aluminum and water includes boehmite, pseudoboehmite, bayerite, gibbsite or combinations of these materials. One of these materials, pseudoboehmite, has been found to have a particularly high conductivity for hydrogen ions while having an extremely low conductivity for electrons.

For batteries made in accordance with the principles of the present invention, a solid electrolyte of hydrated aluminum oxide comprising at least 50% pseudoboehmite is preferred. A solid electrolyte comprising at least 95% pseudoboehmite is most preferred.

Such a solid-electrolyte material of hydrated aluminum oxide can be produced by any of several methods. For example, such a material can be formed on a clean metallic aluminum surface exposed to water in liquid form in a container. Or such a material can be formed on a clean metallic aluminum surface exposed to water in vapor form in a chamber in a temperature range from about 20 degrees Celsius to 374 degrees Celsius. Pseudoboehmite is predominant in films produced in the temperature range from about 90 degrees Celsius to 100 degrees Celsius.

Solid-electrolyte films of the desired form can also be produced by exposing aluminum oxide to water and/or liquid vapor phases. The pseudoboehmite form is predominant in layers produced in the temperature range 90 degrees Celsius to 100 degrees Celsius. The requisite aluminum oxide layers can, for example, be produced by anodization of metallic aluminum. The production of solid-electrolyte films from anodically produced aluminum oxide films has the advantage that such films are characteristically of very uniform thickness and can be grown to precise thicknesses.

Layers of a specified thickness of hydrated aluminum oxide can be produced by a multilayer process that includes alternate steps of aluminum film deposition and exposure of the aluminum or anodized aluminum film surface to water. Radiofrequency sputtering can, for example, be used to deposit the metallic aluminum. Such sputtering yields good uniformity of coverage of the deposited aluminum and hence of the solid electrolyte produced therefrom. Sequential aluminum depositions, each followed by exposure to water as described above, have produced solid-electrolyte protonically conducting films approximately 500 nanometers (nm) thick after 3-to-5 such sequential steps.

Figure 2:
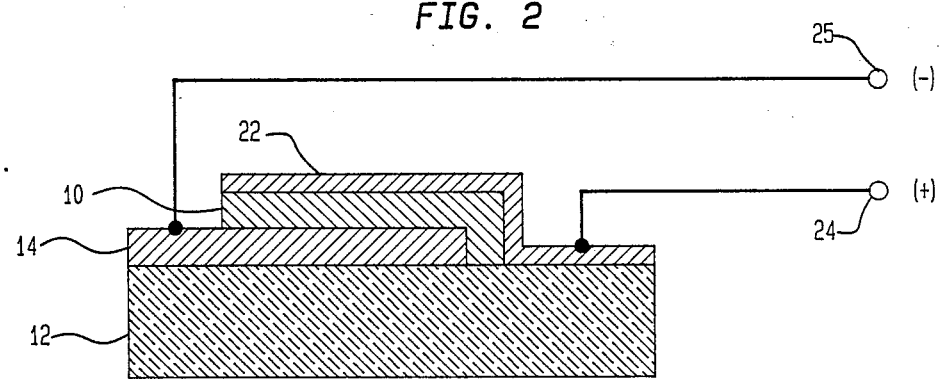
FIG. 2 is a cross-sectional representation of another embodiment of the invention.

The respective batteries shown in FIGS. 1 and 2 each include a solid electrolyte of hydrated aluminum oxide of the form and made by the techniques specified above. In each of FIGS. 1 and 2, the solid-electrolyte layer is designated by reference numeral 10. Illustratively, the layer 10 in each case is approximately 500 nm thick.

Each of the batteries depicted in FIGS. 1 and 2 is supported by a substrate 12 made of an insulating material such as glass. In each battery structure, a negative electrode 14 is formed on the top surface of the substrate 12 by conventional fabrication techniques known in the art of making integrated-circuit or thin-film devices. The negative electrode 14 in each embodiment is made of a conductive material that can be converted to a hydride and then back again to the material itself in a reversible electrochemical reaction during charging and recharging, respectively.

Illustratively, the negative electrodes 14 each comprise pure or essentially pure palladium deposited by direct-current sputtering to a thickness of a least about 50 nm. Alternatively, the electrodes 14 may be made, for example, of a nickel/titanium alloy, or of a nickel/lanthanum alloy. These and other materials are capable of forming metal hydrides in a reversible electrochemical reaction. Herein, for illustrative purposes, the particular batteries discussed in detail below will be assumed to include negative electrodes made of palladium.

In the FIG. 1 battery, the upper or positive electrode 16 is schematically depicted by a relatively thick dashed line. The electrode actually comprises a conductive layer having apertures therethrough. The purpose of these apertures will be apparent later below.

As shown, the electrode 16 of FIG. 1 overlies the top surface of the electrolyte 10 and a right-hand portion of the top surface of the substrate 12. An electrical connection 18 is made to this right-hand portion of the positive electrode. Another electrical connection 20 extends to a left-hand portion of the previously described negative electrode 14. In turn, the connections 18 and 20 are connected to terminals 19 and 21, respectively. During charging of the depicted battery, an external direct-current power source is connected to the terminals 19 and 21. The polarity of the external source with respect to the terminals 19 and 21 is indicated in FIG. 1. Also, these polarity markings indicate the polarity of the direct-current voltage supplied by the FIG. 1 battery when charged.

In accordance with the invention, the positive electrode 16 of FIG. 1 comprises a conductive material that functions as a catalyst for oxygen reduction reactions during discharging of the depicted battery. Platinum, gold, nickel and alloys of platinum comprise suitable such materials. Herein, the particular battery specified below will be assumed to have a positive electrode made of platinum.

Illustratively, the electrode 16 of FIG. 1 is formed by direct-current sputtering a layer of platinum to a thickness of approximately 50 nm. Typically, such a thin layer on the solid electrolyte described herein inherently contains multiple pinholes. The space above the apertured electrode 16 contains air. Alternatively, the FIG. 1 battery may include an enclosure (not shown) for establishing pure oxygen or substantially pure oxygen in the immediate vicinity of the electrode 16.

To charge the battery shown in FIG. 1, an externally applied direct-current voltage that is above the decomposition potential of water is connected to the terminals 19 and 21. A voltage above about 1.2 volts suffices for this purpose.

During charging, at the positive electrode, hydroxyl ions or water in the electrolyte 10 of FIG. 1 yield electrons and oxygen. Electrons flow in the external circuit of FIG. 1 to the palladium electrode 14. Simultaneously, protons flow through the electrolyte 10 to the palladium electrode 14. In response to receipt of electrons and protons, some or all of the palladium electrode is converted to a palladium hydride ($PdH_x$, where $x$ has a value up to about 1.0). The $PdH_x$ stores electrochemical energy for future use during a discharge cycle of operation. Further, oxygen derived from the hydroxyl ions in the electrolyte 10 passes through the apertures in the electrode 16 to the surrounding air (or to any oxygen supply maintained above the electrode 16). The material of the electrode 16 acts as a catalyst for the described oxygen generation reaction that occurs during charging.

Once charged, the battery shown in FIG. 1 is capable of supplying a voltage of about 1 volt to an external load connected between the terminals 19 and 21. Once a load is so connected, protons and electrons are released by the palladium electrode 14 in a reaction that restores some or all of the palladium hydride to pure or essentially pure palladium. More specifically, protons are released by the electrode 14 into the protonically conducting electrolyte 10 and flow toward the positive electrode 16, while electrons so released flow substantially only in the external circuit from the terminal 21 to the terminal 19 and then to the positive electrode 16.

During discharge, electrons flowing to the electrode 16 of FIG. 1 react with water and oxygen in the air (or in a separate oxygen supply) to form hydroxyl ions. In turn, these ions combine with protons flowing through the electrolyte 10 to the electrode 16 to form water and thereby rehydrate the electrolyte. During discharge, the material of the electrode 16 serves to catalyze the noted oxygen reduction reaction which involves the combining of electrons, oxygen and water to from hydroxyl ions.

In accordance with this invention, the positive electrode 22 shown in the battery embodiment of FIG. 2 comprises a material that includes an electrochemically oxidizable and reducible oxide or hydroxide of a transition metal element. Suitable such materials include, for example, nickel hydroxide, titanium oxide, molybdenum oxide and vanadium oxide. For illustrative purposes, a positive electrode 22 made of nickel hydroxide will be specified in detail below.

Nickel hydroxide is a well known material. Various conventional processes are known for forming a thin layer of this material. Illustratively, for the case in which the thickness of the negative electrode 14 of FIG. 2 is about 500 nm and the effective areas of the electrodes 14 and 22 are about the same, the electrode 22 is assumed to have a thickness of approximately 1000 nm.

To charge the particular illustrative FIG. 2 battery, a direct-current voltage of about 1.3 volts is applied to terminals 24 and 25 with the indicated polarity. During the charging process, nickel hydroxide of the electrode 22 is converted to nickel oxyhydroxide, protons and electrons. The protons so produced flow through the electrolyte 10 to the palladium negative electrode 14, while the electrons flow through the external circuit path to the electrode 14. In response to protons and electrons supplied thereto, some or all of the palladium electrode 14 is converted to $PdH_x$, where x has a value up to about 1.0.

Once charged, the particular illustrative battery shown in FIG. 2 is capable of supplying a direct-current voltage of about 1.2 volts to an external load connected between the terminals 24 and 25. Once a load is so connected, protons and electrons are released by the palladium electrode 14 in a reaction that restores some or all of the palladium hydride to pure or essentially pure palladium. More specifically, protons are released by the electrode 14 into the protonically conducting electrolyte 10 and flow toward the positive electrode 22, while electrons so released flow substantially only in the external circuit from the terminal 25 to the terminal 24 and then to the positive electrode 22.

At the positive electrode 22 of the FIG. 2 battery, incoming electrons and protons combine with the aforementioned nickel oxyhydroxide during discharge. Specifically, they combine therewith to partially or completely reform the original positive electrode material, namely, nickel hydroxide. Once the positive electrode is completely or nearly completely reformed to the original material, the depicted battery must of course then be recharged.

Finally, it is to be understood that the above-described arrangements are only illustrative of the principles of the present invention. In accordance with these principles, numerous modifications and alternatives may be devised by those skilled in the art without departing from the spirit and scope of the invention. For example, although primary emphasis herein has been directed to the negative electrode comprising a metal species capable of reversibly combining with hydrogen, it is to be understood that in some embodiments the negative electrode may comprise a metal oxide or hydroxide capable of reversibly combining with electrons and protons.

What is claimed is:

1. A rechargeable battery comprising
   positive electrode means including a first metal species,
   negative electrode means including a second metal species,
   and a solid electrolyte including protonically conducting hydrated aluminum oxide between and in contact with said positive and negative electrode means,
   said negative electrode means being responsive to an external charging source connected to said positive and negative electrode means to form a metal hydride and capable, during a discharging cycle, to supply protons to said solid electrolyte and to supply electrons to an external load connected to said positive and negative electrode means.

2. A battery as in claim 1 in which said hydrated aluminum oxide comprises pseudoboemite.

3. A battery as in claim 2 in which said second metal species is capable of reversibly combining with hydrogen or with protons and electrons.

4. A battery as in claim 3 in which said second metal species is a hydride-forming metal.

5. A battery as in claim 4 wherein said second metal species is selected from the group consisting of palladium, nickel/titanium alloys and nickel/lanthanum alloys.

6. A battery as in claim 3 wherein said first metal species is a catalyst for oxygen reduction reactions.

7. A battery as in claim 6 wherein said first metal species is selected from the group consisting of platinum, gold, nickel and alloys of platinum.

8. A battery as in claim 7 wherein said positive electrode means is permeable to oxygen.

9. A battery as in claim 8 wherein said positive electrode means comprises an apertured layer of material including said first metal species.

10. A battery as in claim 9 wherein said apertured layer is exposed to a source of oxygen.

11. A battery as in claim 10 wherein said apertured layer is exposed to air.

12. A battery as in claim 3 wherein said first metal species is a transition metal element.

13. A battery as in claim 12 wherein said positive electrode means comprises an oxide or hydroxide of a transition metal element.

14. A battery as in claim 13 wherein said positive electrode comprises a material selected from the group consisting of nickel hydroxide, titanium oxide, molybdenum oxide and vanadium oxide.

15. A battery as in claim 3 fabricated in thin-film form on an integrated-circuit chip and adapted to serve as a rechargeable power supply for devices included on said chip.

* * * * *